United States Patent [19]
Cole, Jr. et al.

[11] Patent Number: 5,548,099
[45] Date of Patent: Aug. 20, 1996

[54] METHOD FOR MAKING AN ELECTRONICS MODULE HAVING AIR BRIDGE PROTECTION WITHOUT LARGE AREA ABLATION

[75] Inventors: Herbert S. Cole, Jr., Burnt Hills; Theresa A. Sitnik-Nieters, Rexford, both of N.Y.

[73] Assignee: Martin Marietta Corporation, King of Prussia, Pa.

[21] Appl. No.: 304,920

[22] Filed: Sep. 13, 1994

[51] Int. Cl.[6] .......................... B23K 26/00; H01L 21/60; H05K 3/30
[52] U.S. Cl. .................... 219/121.69; 437/209; 437/211; 437/225; 29/832
[58] Field of Search .................................... 437/209–213, 437/225; 427/96; 219/121.6, 121.67, 121.68, 121.69; 29/832, 841; 361/760–761, 783, 792–795, 803; 257/750, 758; 174/260, 261–264

[56] References Cited

U.S. PATENT DOCUMENTS 4,783,695  11/1988  Eichelberger et al. .
4,835,704   5/1989  Eichelberger et al. ................. 364/490
4,878,991  11/1989  Eichelberger et al. ................. 156/630
4,894,115   1/1990  Eichelberger et al. ................. 156/643
4,933,042   6/1990  Eichelberger et al. ................. 156/239
5,161,093  11/1992  Gorczyca et al. .
5,331,203   7/1994  Wojnarowski et al. ................ 257/698
5,338,975   8/1994  Cole, Jr. et al. ....................... 257/750
5,422,513   6/1995  Marcinkiewicz et al. ............. 257/758

Primary Examiner—Bot L. Ledynh
Attorney, Agent, or Firm—Brian J. Rees; Geoffrey H. Krauss

[57] ABSTRACT

In a method for preserving an air bridge structure on an integrated circuit chip, without sacrificing metallization routing area in an overlying high density interconnect structure, a protective layer is sublimed over the air bridge to provide mechanical strength while preventing contamination and deformation during processing. A high density interconnect structure is applied over the chip and protective layer. A small portion of the high density interconnect structure is removed from the area over the air bridge structure, and the protective layer is then sublimed away, leaving the resultant structure with an undamaged air bridge which is free of residue.

11 Claims, 4 Drawing Sheets

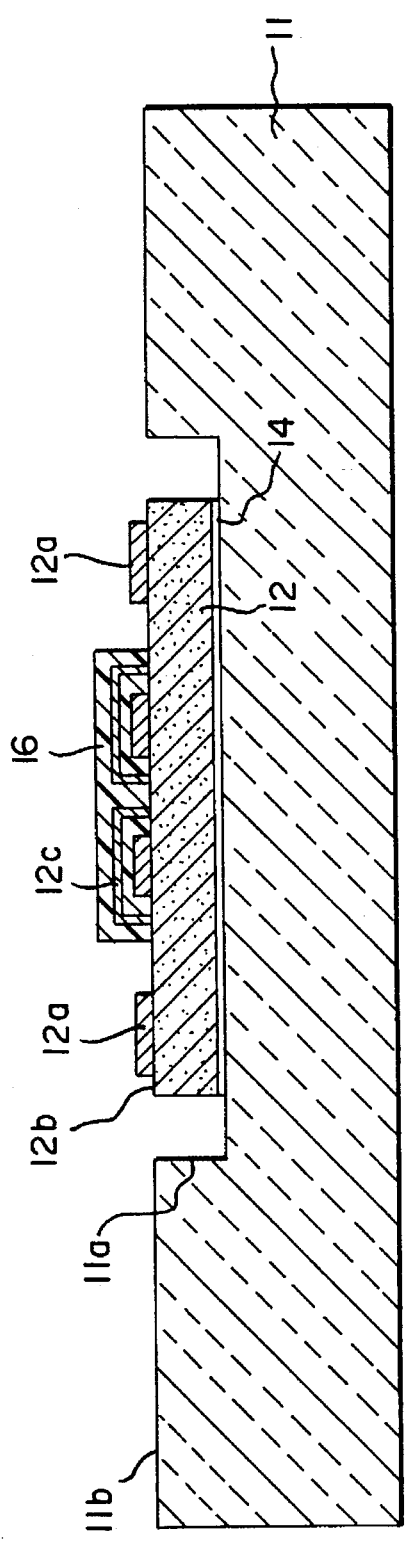
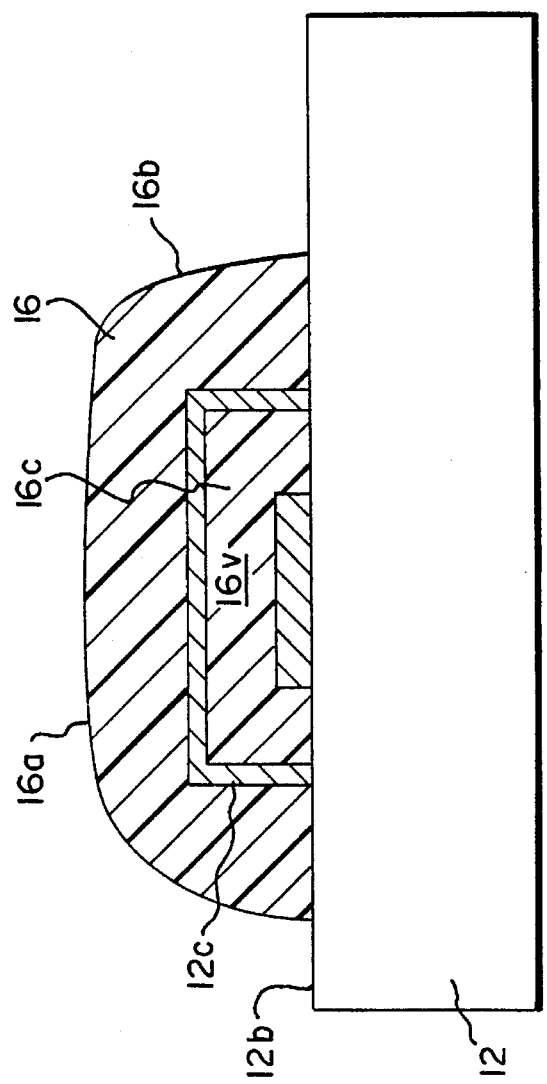

METHOD FOR MAKING AN ELECTRONICS MODULE HAVING AIR BRIDGE PROTECTION WITHOUT LARGE AREA ABLATION

BACKGROUND OF THE INVENTION

This invention relates generally to integrated circuit packaging incorporating a high density interconnect structure, and more particularly to packaging high speed devices having sensitive structures such as air bridge structures, with a protective material, which after lamination of the high density interconnect structure can be removed without ablating a large area of the high density interconnect structure.

In the fabrication of certain multi-chip module (MCM) circuits, high performance is accomplished by the use of high speed gallium arsenide (GaAs) devices having delicate structures which can easily be damaged or destroyed during fabrication. These include conductors which are spaced from the surface of the GaAs by an air gap—a structure which is known as an air bridge. Air bridges are used in these circuits to provide improved signal propagation and reduced capacitive coupling over that possible with conventional chip wiring.

The interconnect structure used in the fabrication of high density interconnect (HDI) circuits has many advantages in the compact assembly of MCMs. For example, a multi-chip electronic system (such as a microcomputer incorporating 30–50 chips) can be fully assembled and interconnected by a suitable HDI structure on a single substrate, to form a unitary package which is 2 inches long by 2 inches wide by 0.050 inches thick. Even more important, the interconnect structure can be disassembled from the substrate for repair or replacement of a faulty component and then reassembled without significant risk to the good components incorporated within the system. This is particularly important where many (e.g., 50) chips, each being very costly, may be incorporated in a single system on one substrate. This repairability feature is a substantial advance over prior connection systems in which reworking the system to replace damaged components was either impossible or involved substantial risk to the good components.

Briefly, in this high density interconnect structure, a ceramic substrate such as alumina which may be 50–100 mils thick and of appropriate size and strength for the overall system, is provided. This size is typically less than 2 inches square, but may be made larger or smaller. Once the position of the various chips has been specified, individual cavities or one large cavity having appropriate depth at the intended locations of differing chips, is prepared. This may be done by starting with a bare substrate having a uniform thickness and the desired size. Conventional, ultrasonic or laser milling may be used to form the cavities in which the various chips and other components will be positioned. For many systems where it is desired to place chips nearly edge-to-edge, a single large cavity is satisfactory. That large cavity may typically have a uniform depth where the semiconductor chips have a substantially uniform thickness. The cavity bottom may be made respectively deeper or shallower at a location where a particularly thick or thin component will be placed, so that the upper surface of the corresponding component is in substantially the same plane as the upper surface of the rest of the components and the portion of the substrate which surrounds the cavity. The bottom of the cavity is then provided with a thermoplastic adhesive layer, which may preferably be a polyetherimide resin (such as ULTEM® 6000 resin, available from the General Electric Company, Fairfield, Conn.), or an adhesive composition such as is described in U.S. Pat. No. 5,270,371, herein incorporated in its entirety by reference. The various components are then placed in their desired locations within the cavity and the entire structure is heated to remove solvent and thermoplastically bond the individual components to the substrate.

Thereafter, a film (which may be KAPTON® polyimide, available from E. I. du Pont de Nemours Company, Wilmington, Del.), of a thickness of approximately 0.0005–0.003 inches (approx. 12.5–75 microns), is pretreated by reactive ion etching (RIE) to promote adhesion. The substrate and chips must then be coated with ULTEM® 1000 polyetherimide resin or another thermoplastic adhesive to adhere the KAPTON® resin film when it is laminated across the tops of the chips, any other components and the substrate. Application of the ULTEM® resin adhesive is an extra processing step that must be used if a thermoplastic adhesive is to hold the KAPTON® resin film in place. Thereafter, via holes are provided (preferably by laser drilling) through the KAPTON® resin film, and ULTEM® resin layers, at locations in alignment with the contact pads on the electronic components to which it is desired to make contact. A multi-sublayer metallization layer, with a first sublayer comprising titanium and a second layer comprising copper, is deposited over the KAPTON® resin layer and extends into the via holes to make electrical contact to the contact pads disposed thereunder. This metallization layer may be patterned to form individual conductors during the deposition process or may be deposited as a continuous layer and then patterned using photoresist and etching. The photoresist is preferably exposed using a laser to provide an accurately aligned conductor pattern at the end of the process. Alternatively, exposure through a mask may be used.

Additional dielectric and metallization layers are provided as required in order to provide all of the desired electrical connections among the chips. Any misposition of the individual electronic components and their contact pads is compensated for by an adaptive laser lithography system which is the subject of some of the patents and applications listed hereinafter.

This high density interconnect structure provides many advantages. Included among these are the lightest weight and smallest volume packaging of such an electronic system presently available. A further, and possibly more significant, advantage of this high density interconnect structure, is the short time required to design and fabricate a system using this high density interconnect structure. Prior art processes require the prepackaging of each semiconductor chip, the design of a multilayer circuit board to interconnect the various packaged chips, and so forth. Multilayer circuit boards are expensive and require substantial lead time for their fabrication. In contrast, the only thing which must be specially pre-fabricated for the HDI system is the substrate on which the individual semiconductor chips will be mounted. This substrate is a standard stock item, other than the requirement that the substrate have appropriate cavities therein for the placement of the semiconductor chips so that the interconnect surface of the various chips and the substrate will be in a single plane. In the HDI process, the required cavities may be formed in an already fired ceramic substrate by conventional or laser milling. This process is straight-forward and fairly rapid with the result that once a desired configuration of the substrate has been established, a corresponding physical substrate can be made ready for the mounting of the semiconductor chips in as little as 1 day and typically 4 hours for small quantities as are suitable for research or prototype systems to confirm the design prior to quantity production.

The process of designing an interconnection pattern for interconnecting all of the chips and components of an electronic system on a single high density interconnect substrate normally takes somewhere between one week and five weeks. Once that interconnect structure has been defined, assembly of the system on the substrate and the overlay structure is built-up on top of the chips and substrate, one layer at a time. This process can be finished in as little as four hours, as described in U.S. Pat. No. 5,214,655, entitled "Integrated Circuit Packaging Configuration for Rapid Customized Design and Unique test Capability" by C. W. Eichelberger, et al., herein incorporated in its entirety by reference. Consequently, this high density interconnect structure not only results in a substantially lighter weight and more compact package for an electronic system, but enables a prototype of the system to be fabricated and tested in a much shorter time than is required with other packaging techniques.

This high density interconnect structure, methods of fabricating it and tools for fabricating it are disclosed in U.S. Pat. No. 4,783,695, entitled "Multichip Integrated Circuit Packaging Configuration and Method" by C. W. Eichelberger, et al.; U.S. Pat. No. 5,127,998, entitled "Area-Selective Metallization Process" by H. S. Cole et al.; U.S. Pat. No. 5,127,844, entitled "Area-Selective Metallization Process" by H. S. Cole, et al.; U.S. Pat. No. 5,169,678, entitled "Locally Orientation Specific Routing System" by T. R. Haller, et al.; and U.S. Pat. No. 5,108,825, entitled "An Epoxy/Polyimide Copolymer Blend Dielectric and Layered Circuits Incorporating It" by C. W. Eichelberger, et al; U.S. application Ser. No. 07/987,849, entitled "Plasticized Polyetherimide Adhesive Composition and Usage" by Lupinski et al. Each of these Patents and Patent Applications, including the references contained therein, is hereby incorporated in its entirety by reference.

This high density interconnect structure has been developed for use in interconnecting semiconductor chips to form digital systems. That is, for the connection of systems whose operating frequencies are typically less than about 50 MHz, which is low enough that transmission line, other wave impedance matching and dielectric loading effects have not needed to be considered.

The interconnection of structures or devices intended to operate at very high frequencies presents many challenges not faced in the interconnection of digital systems. For example, use of gigahertz frequencies requires consideration of wave characteristics, transmission line effects and material properties. Also, use of high frequencies requires the consideration of the presence of exposed delicate structures on MCMs and other components and system and component characteristics which do not exist at the lower operating frequencies of such digital systems. These considerations include the question of whether the dielectric materials are suitable for use at gigahertz frequencies, since materials which are good dielectrics at lower frequencies can be quite lossy or even conductive at high frequencies. Further, even if the dielectric is not lossy at gigahertz frequencies, its dielectric constant itself may be high enough to unacceptably modify the operating characteristics of MCMs or air bridges.

As stated above, the interconnect structure used in the fabrication of HDI circuits is created from alternating layers of laminated dielectric films and patterned metal film. In the process of laminating the dielectric layers, the adhesive used to bond the dielectric layers is caused to flow and form a quality, void-free interface. There is a substantial concern that air bridges and other sensitive structures may be modified, damaged or destroyed by the lamination pressure. Also, these sensitive structures may be overlay sensitive, i.e., the operating characteristics of the device or component may be different when the device or component is free of interconnection dielectric material than when these devices have high density interconnect dielectric layers disposed over them. Lamination as well as other processing steps may also cause the thermoplastic adhesive to infiltrate the air gap under the conductor, thereby modifying the dielectric properties of that gap.

Since there are sensitive structures present, low temperature processing is needed to ensure that these structures are not damaged during multi-chip module fabrication. For example, chips of certain semiconductors (GaAs, InSb and HgCdTe), as well as the structures on these chips, e.g., air bridges, are very sensitive to processing in high temperature regimes. For fabrication of multichip modules incorporating these chips, a high density interconnect structure is required with processing temperatures below 260° C.

To maintain the performance advantage of having air, or some other electrical insulator, as the dielectric medium, the MCM fabrication process must be designed to provide a means of preserving these air bridge structures from intrusion by other materials.

For example, related application Ser. No. 07/869,090 filed on Apr. 14, 1992, by W. P. Kornrumpf et al., and entitled, "High Density Interconnected Microwave Circuit Assembly" teaches removing the high density interconnect dielectric from portions of the chip which are overlay sensitive. That is, after the HDI structure is laminated, the portion of the HDI structure overlying the sensitive structure is removed by ablation. Removing the HDI structure improves the performance of the sensitive structure, e.g., air bridge, because there is no overlying material. However, ablating the overlying material does not prevent adhesive from flowing under the bridge during processing; nor does it prevent the lamination pressure from occasionally damaging or even collapsing the air bridge. As will be discussed hereinbelow, removing the HDI structure over the sensitive structure also decreases the area available for routing the electrical conductors within the HDI structure and severely restricts the potential usefulness of the HDI technique. This patent application, including the references contained therein, is hereby incorporated in its entirety by reference.

Related U.S. Pat. No. 5,331,203, filed Apr. 5, 1990, by Wojnarowski et al., and entitled "A High Density Interconnect Structure Including a Chamber" teaches bonding the chip containing a sensitive structure into a deep chip-well. Since the chip-well is deeper than the chip is thick, there is a space created over the surface of the chip. A first dielectric layer is laminated such that this layer is only attached to a plateau portion of the substrate and to the upper surface of the chip. This first dielectric layer is not applied over the sensitive structure. Then, the remainder of the HDI structure is laminated, thereby creating a "chamber" of air over the sensitive structure. If successfully laminated, this technique creates a space over the sensitive structure to allow it to work properly. However, in practice this lamination procedure is very difficult to reproduce without damaging the sensitive structure. Because the second dielectric layer has adhesive, it is still difficult to produce a module where the adhesive from this layer does not infiltrate the space under the air bridge. Furthermore, because the chip is in a deep chip-well it is difficult to make electrical contact with the chip pads through the via holes with the metallization layer within the high density interconnect structure. This patent application, including the references contained therein, is hereby incorporated in its entirety by reference.

Related application Ser. No. 07/546,965, filed July 2, 1990, by Cole et al, and entitled "High Density Interconnection Including a Spacer and a Gap", teaches applying spacers over the contact pads present on the integrated circuit chips, and then stretching the first HDI dielectric layer over these spacers such that the dielectric layer does not contact the chip surface. This application provides a method of fabricating a HDI module incorporating a sensitive chip structure without the dielectric layer of the high density interconnect structure inhibiting the chip's performance. However, since the adhesive from the first dielectric layer is designed to flow and form a void free layer, it may contaminate any sensitive structure which is placed between the spacers. Also, because the high density interconnect structure is supported only by the spacers, there may be difficulties with the dielectric layers sagging and causing interruptions in the metallization layers. This patent application, including the references contained therein, is hereby incorporated in its entirety by reference.

Related application Ser. No. 08/046,299, entitled "High Density Interconnection of Substrates and Integrated Circuit Chips containing Sensitive Structures", to Cole et al. teaches laying down a solvent soluble layer to "protect" the air bridge during lamination of the HDI structure. Once the module is fully worked-up, the HDI structure which overlays the sensitive structure is ablated away and the module is immersed in a solvent to remove the protective layer. This method, although very labor intensive, inhibits damage to the air bridge and prohibits the adhesive from getting under the bridge during lamination of the high density interconnect structure. This patent application, including the references contained therein, is hereby incorporated in its entirety by reference.

Unfortunately, the teaching disclosed in the last-mentioned application suffers from the disadvantage that the need to exclude the high density interconnect structure from the surface of overlay-sensitive components severely restricts the surface area available for the routing of the high density interconnect structure metallization layers since they cannot be routed over the area from which the dielectric layer is to be removed. Where chips are closely packed for maximum density, this essentially limits the high density interconnect structure to the routing of conductors in the "streets" and "avenues" portion of the structure which extends from the contact pads of one chip to the contact pads of the adjacent chip. For systems where high density of interconnect conductors is required, such a restriction can require excessive numbers of layers of interconnect conductors, require that the chips be spaced further apart than would otherwise be necessary, or even make a system unroutable.

Consequently, an improved method for protecting sensitive structures which does not disrupt the routing of the metallization layers within the high density interconnect structure, is desirable.

OBJECTS OF THE INVENTION

Accordingly, a primary object of the invention is to provide multi-chip modules fabricated with clean air bridges in a manner which does not sacrifice any metallization routing area in an overlying high density interconnect structure.

SUMMARY OF THE INVENTION

Briefly, according to the invention, a method for preserving an air bridge structure on an integrated circuit chip having chip pads includes the step of applying a sublimable protective layer over the air bridge. The protective layer can be applied solely to the air bridge, or applied to the entire substrate surface with the material then removed at areas other than those over the air bridge. A high density interconnect structure is applied over the chip and substrate with metallization layers interconnected to the chip pads. The protective layer provides mechanical strength during the application of the high density interconnect structure to prevent deformation during processing. It also prevents any contamination from intruding under the air bridge. A small portion of the high density interconnect structure is removed from the area over the air bridge structure, and the protective layer is then sublimed away to leave a multi-chip module with an undamaged air bridge which is free of residue.

BRIEF DESCRIPTION OF THE DRAWINGS

The subject matter which is regarded as the invention is particularly pointed out and distinctly claimed in the concluding portion of the specification. The invention, together with further objects and advantages thereof, may best be understood by reference to the following description taken in connection with the accompanying drawings in which:

FIGS. 1(a)–(d) are cross-sectional views of a multi-chip module at various progressive stages of a procedure for using a protective layer to provide mechanical support for an air bridge structure in micro-electronic circuitry;

FIG. 2 is a cross-sectional view of a chip with an air bridge structure encapsulated with a protective layer to provide mechanical support on all sides during processing.

DETAILED DESCRIPTION

Figure 1B:
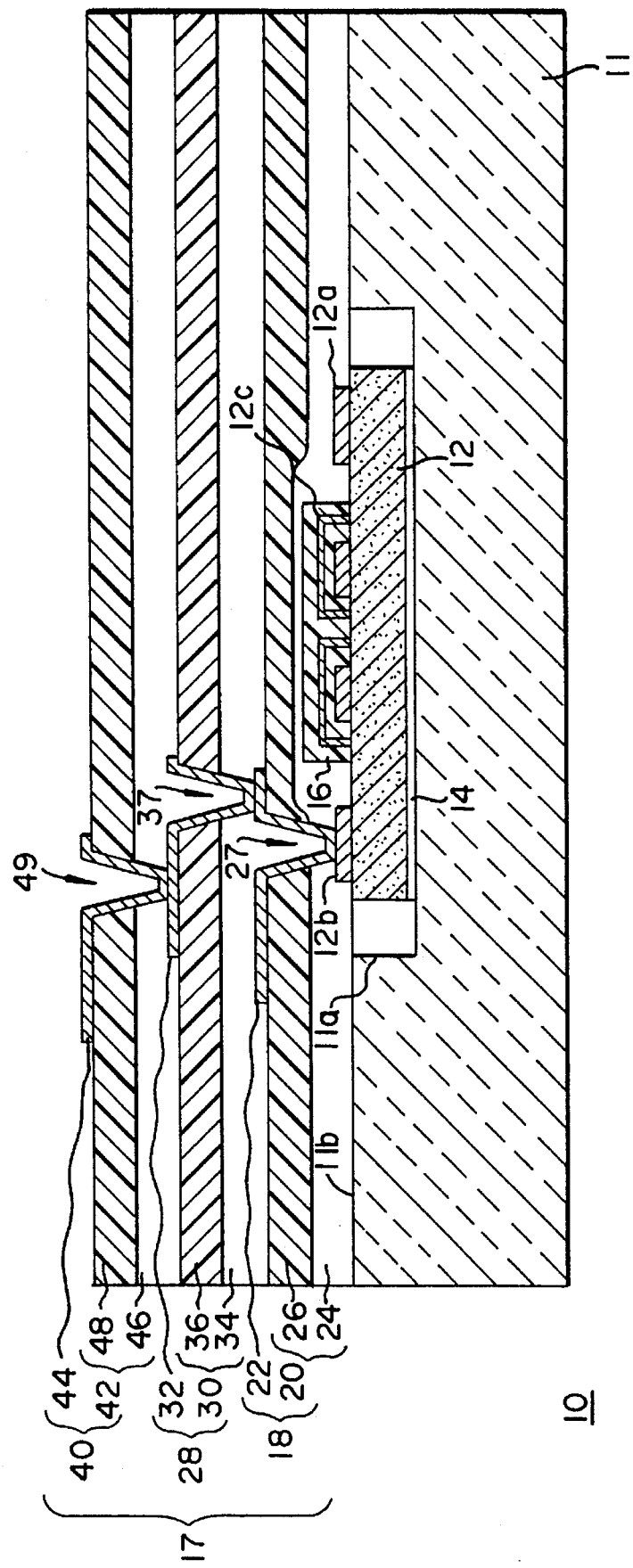

Referring initially to FIG. 1(a), a multichip module 10 has a substrate 11 with a plurality of chip cavities 11a formed therein, through a top surface 11b thereof. An integrated circuit chip 12 or another electronic component is disposed in each chipwell 11a. Electronic components 12 may be bonded to the substrate 11 with a layer of a thermoplastic adhesive 14; these electronic components 12 have contact pads 12a on an upper contact surface 12b thereof. These electronic components 12 also have sensitive structures, such as air bridges 12c, on upper surface 12b.

In accordance with the invention, a protective layer 16 is applied over and around the sensitive structure 12c creating an encapsulating volume 16v, as shown in FIG. 2. This encapsulating volume 16v includes the area comprising the protective layer 16 as defined by a top surface 16a, sides 16b and a bottom 12c, as well as the area 16c underneath the air bridge which is essentially filled with protective layer 16. This encapsulation volume 16v has (1) a lower surface defined by the substrate surface plane, or the chip surface 12c, (2) an upper surface 16a spaced a distance above said sensitive structure (approximately less than 4 times the sensitive structure's height), and (3) walls 16b which generally extend from the lower surface to the upper surface.

This protective layer 16 supports the sensitive structure from all sides, and may be applied by masking the entire surface of the substrate surface 11b except the sensitive structure 12c, such that the protective layer 16 is only applied to the sensitive structure 12c. Alternatively, the entire substrate surface 11b may be coated with the protective layer 16 and then the protective layer 16 can be ablated away everywhere except over the sensitive structure 12c.

The protective layer 16 is preferably an organic monomer. This organic monomer 16 is applied to the substrate surface 11b through sublimation by conventional vacuum processes. The thickness of the sublimed monomer 16 is controlled by time, temperature and pressure during the deposition process. The organic monomer preferably has a sufficient vapor pressure (about 10 torr) at temperatures of about 170° C. to allow the material to be sublimed on to the chip surface 12b. These monomers also preferably have a melting point in excess of the processing temperature they will be exposed to, which in this case can be as high as about 260° C. This ensures that the protective layer will have sufficient mechanical integrity during the lamination sequence of the first dielectric layer and thus prevent the sensitive structures (air bridges) from being crushed or deformed. Several commercially available chemicals, such as those found in the Aldrich Chemical Catalog or Eastman Organic Chemicals Catalog, including naphthalene and anthraquinone derivatives can be utilized. Presently preferred materials include perylene, anthraquinone, alizarin and quinalizarin (all with melting points above 275° C.), with alizarin being the most preferred at this time. Additional organic monomers that meet the melting point and sublimation criteria can be found in the Handbook of Physics and Chemistry. Any high melting pint material that can be sublimed at about 170° C. will work in this invention, although it should be understood that monomers with extremely low vapor pressure will require longer vacuum baking to remove all of the material after module processing than monomers with higher vapor pressures.

The final structure of a high density interconnect structure 17 fabricated above the chips 12 (and the sensitive structures 12c) on the substrate upper surface 11b is shown in FIG. 1(b). A first stratum 18 of the overlying high density interconnect structure 17 comprises a dielectric layer 20 supporting a patterned metallization layer 22. The dielectric layer 20 has separate lower and upper sublayers 24 and 26, respectively, and supports the patterned metallization layer 22 which extends into contact with contact pads 12a on the substrate 11 within via holes 27 in the dielectric layer. The lower dielectric sublayer 24 is a thermoplastic adhesive which can be processed at temperatures below 260° C. As referenced hereinabove, U.S. application Ser. No. 07/987,849, teaches a plasticized polyetherimide adhesive, such as "Ultem"/"Benzoflex" (Ultem is a trademark of General Electric Co, Pittsfield, Mass., for a polyetherimide resin, and Benzoflex is a trademark of Velsicol Chemical Corp., Rosemont, Ill., or pentaerythritol tetrabenzoate). The upper dielectric sublayer 26 is preferably a thermoset material (for example, a KAPTON® film). Other materials, including thermoplastics which exhibit sufficient stability, may also be used for the upper dielectric sublayer 26.

A second stratum 28 of the high density interconnect structure comprises a second dielectric layer 30 supporting a second patterned metallization layer 32. The dielectric layer 30 has separate lower and upper sublayers 34 and 36, respectively. The second lower sublayer 34 is may be a siloxane polyimide/epoxy (SPIE) adhesive system as described in commonly assigned U.S. Pat. No. 5,161,093, issued Nov. 3, 1992, to Gorczyca et al, which is herein incorporated by reference in its entirety. Since this second dielectric layer is a SPIE thermosetting copolymer, and therefore changes its glass transition temperature value upon curing, laminating multiple layers does not affect lower layers. Via holes 37 are drilled and another patterned metallization sublayer 32 extends into via holes 37 in the dielectric layer 30 to make contact with the first metallization layer 22. If desired, selected via holes may extend through the first dielectric layer 20 as well to provide direct contact to selected contact pads 12a.

The third stratum 40 of the high density interconnect structure comprises a third dielectric layer 42 supporting a third patterned metallization layer 44. The dielectric layer 42 has separate lower and upper sublayers 46 and 48, respectively. The third lower dielectric sublayer is preferably a siloxane polyimide/epoxy (SPIE) adhesive. The third stratum also comprises a third patterned metallization layer 44. The third upper dielectric sublayer 48 may again be a thermoset material or a thermoplastic material and is preferably a thermoset material, i.e., KAPTON® film. Lamination of this third stratum 40 is followed by via drilling which extends vias 49 through the stratum 40 such that the patterned metallization layer 44 will connect to the metal layer 32 of the second dielectric layer 28.

Additional (fourth, fifth, sixth, etc.) strata of the high density interconnect structure 17 are not shown in FIG. 1(b), but, if used, will be essentially identical to the lower strata 18, 28 and 40. Each additional upper stratum would comprise a dielectric layer having a thermosetting adhesive (preferably a SPIE blend) and having via holes therein, and a patterned metallization layer making contact with the patterned metallization of the next lower patterned metallization layer through the via holes. Other strata can be added in accordance with the above description.

In this structure, the SPIE crosslinking copolymer blend adhesive materials used as the lower dielectric sublayer in the second and higher strata are selected so that these adhesive materials become set at a low enough temperature that curing the adhesive materials has no adverse effect on the high density interconnect structure or the electronic components being connected thereby. Correct selection of the curing properties of the adhesive materials allows the structure to be fabricated and, if need be, disassembled and reassembled without an adverse effect on the electronic components being interconnected.

Figure 1C:
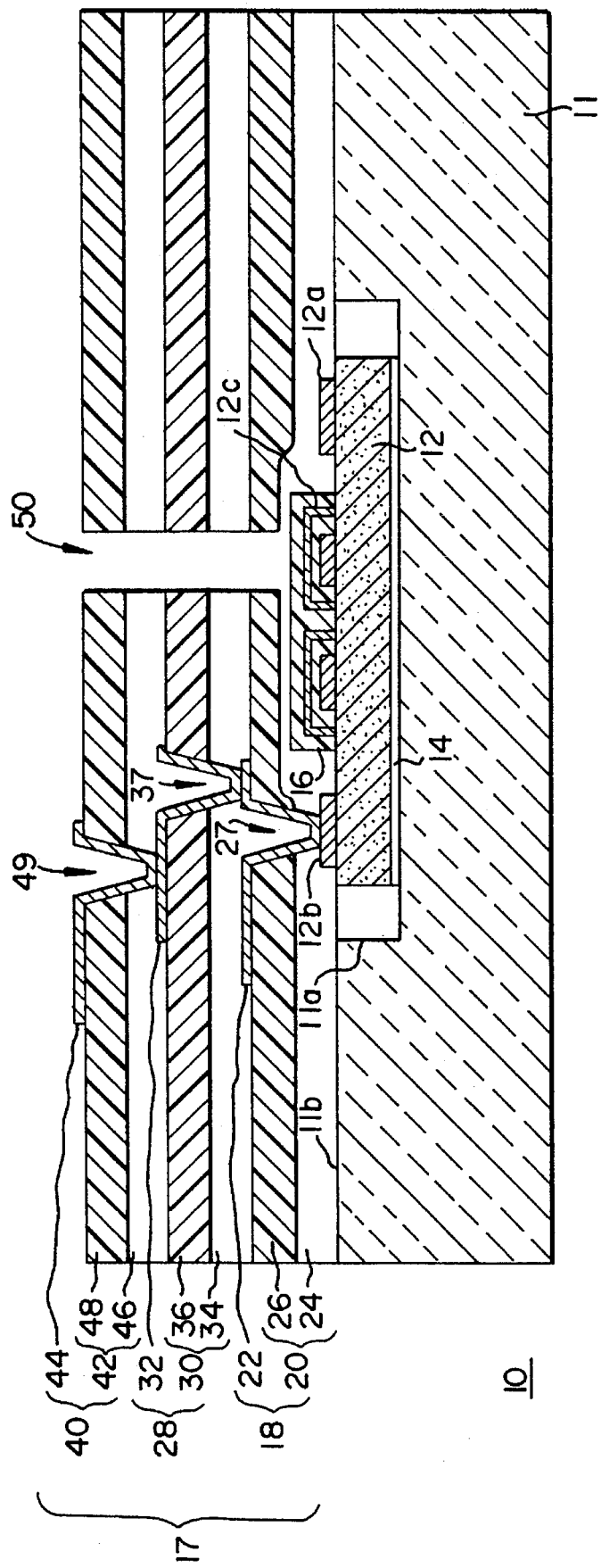

After the high density interconnect structure 17 is complete, a channel 50 can be created in the high density interconnect structure 17 by removing a portion of the high density structure stretching form the encapsulating volume (not labeled) to the module surface, as shown in FIG. 1(c). This channel will expose the protective layer 16. The channel is preferably created by laser ablating the high density interconnect structure. The dielectric layers of the high density interconnect structure 17 of the present invention must therefore be laser ablatable or should be rendered laser ablatable in accordance with U.S. patent application Ser. No. 456,421, entitled, "Laser Ablatable Polymer Dielectrics and Methods," herein incorporated by reference in its entirety. The channel 50 may be smaller than the area covered by the protective polymer 16. It is desirable that the entire region covering the air bridge 12c not be removed in order to allow additional room in the high density interconnect structure 17 for routing of the metallization layers (22, 32, 44, etc.). Preferably, the channel 50 is less than 50 percent of the size of the encapsulating volume.

Figure 1D:
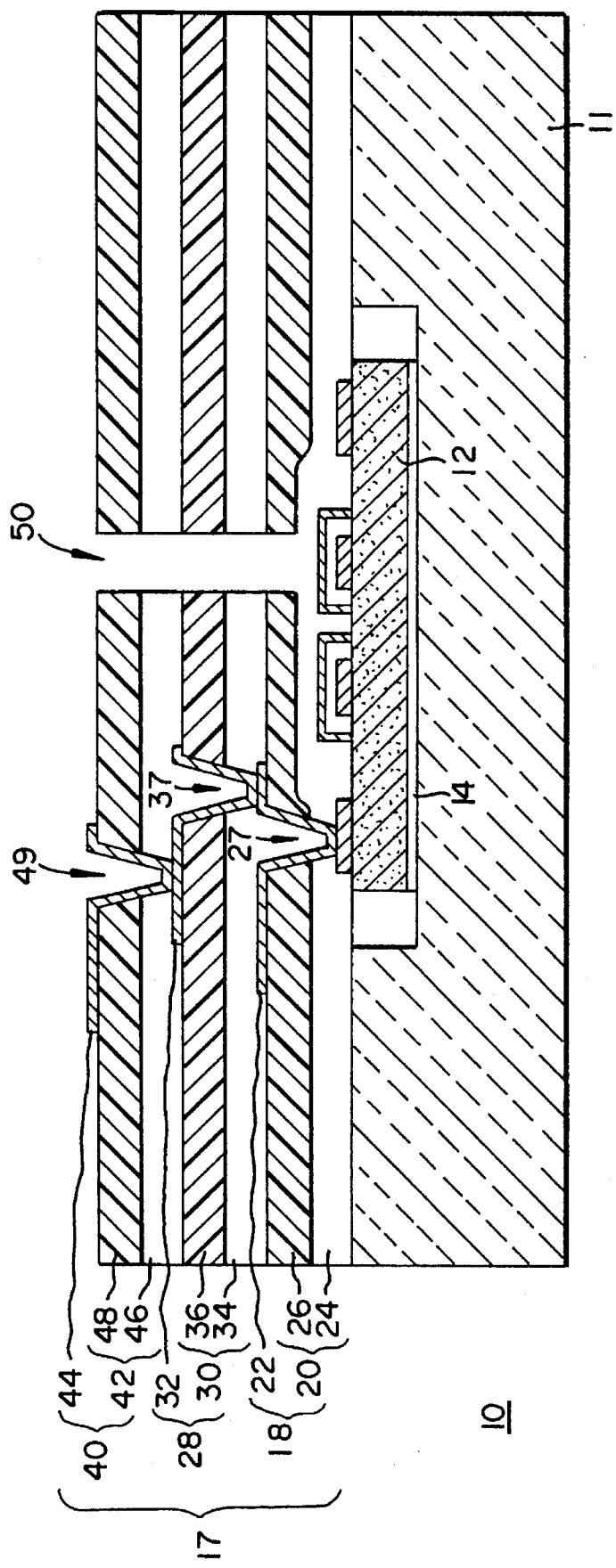

The protective material 16 can be removed from the volume encapsulating the air bridge 12c by heating the module to a temperature, and pulling a vacuum, sufficient to sublime the monomer. The temperature and pressure sufficient to sublime the illustrative alizarin monomer is approximately 170° C. and 0.01 torr, respectively. Due to the low vacuum environment, the sublimated material will be removed from the high density interconnect structure and pumped away, leaving the air bridge free from any contamination, as shown in FIG. 1(d).

At this point the fabricated module may be complete; various metallization layers 22, 32, 44 will carry power, ground, and at least one set of signal conductors. And since only a small portion of the high density interconnect structure is removed, there are little or no limitations on how the metallization layers must be routed.

EXAMPLES

The following illustrative examples are not intended to limit the scope of this invention but to illustrate its application and use:

Example 1

A vacuum sublimation apparatus was set up and various organic molecules were evaluated as candidate materials for this application. Molecules such as perylene, anthraquinone and alizarin (an anthraquinone derivative) were successfully sublimed onto silicon. The silicon chips were mounted on the cold plate of the sublimation apparatus using masking tape. The organic monomers were deposited as polycrystalline layers with reasonable adhesion. Films as thick as 25 microns were sublimed. The silicon chips were masked using standard masking tape for this experiment. After coating, the parts were removed and placed back in a vacuum oven to determine what heat and vacuum conditions would be needed to remove the molecule. In all instances, the monomers are sublimed off the silicon at temperatures in the range of 165° C. and pressures of about 0.01 torr.

Example 2

A chip was coated with 25 microns of alizarin and was placed on an alumina substrate using epoxy die attach techniques. "Kapton" polyimide film was then laminated over the part using an "Ultem" polyetherimide/"Benzoflex" pentaerythritol tetrabenzoate adhesive mixture at 260° C. Three via holes (500×500 microns in size) were laser drilled through this film/adhesive layer to provide an opening that the alizarin could be sublimed through. A roughing pump and liquid nitrogen trap were used with a vacuum oven set at 170° C. The sample was placed in the vacuum oven overnight, removed and inspected. It was observed that the alizarin underneath the laminant layer had been substantially removed from the chip surface in the regions of the via holes, extending in excess of 500 microns in all directions from the via holes.

While the invention has been described in detail herein in accordance with certain preferred embodiments thereof, many modifications and changes therein may be effected by those skilled in the art. Accordingly, it is our intent to be limited only by the scope of the appending claims and not by way of the details and instrumentalities describing the embodiments shown herein.

What is claimed is:

1. A method for making an electronics module, comprising the steps of:
    (1) disposing a plurality of electronic chips on a substrate surface, at least some of the chips including contact pads, and at least one of the chips including a sensitive structure;
    (2) encapsulating the sensitive structure with a sublimable protective layer thereby creating an encapsulating volume, the sublimable protective layer supporting the sensitive structure from all sides, and inhibiting the sensitive structure from processing contamination;
    (3) applying at least one multilayer of a high density interconnect structure, comprising the steps of:
        (a) applying a dielectric film layer over the chips and the substrate surface;
        (b) providing a plurality of via openings in the dielectric film layer, the openings being disposed over at least some of the contact pads; and
        (c) providing a pattern of electrical conductors on the film layer so that the conductors extend between the via openings so as to electrically connect selected contact pads;
    (4) removing a portion of the multilayer of high density interconnect structure to provide a channel extending from the encapsulating volume through the high density interconnect structure to an exterior surface; and
    (5) removing the protective layer from the encapsulating volume through the channel.

2. The method for making an electronics module according to claim 1, wherein the method is carried out at a temperature between about 240° C. and 260° C.

3. The method for making an electronics module according to claim 1, wherein the channel is orthogonal with respect to the substrate surface.

4. The method for making an electronics module according to claim 1, wherein the protective layer is an organic monomer.

5. The method for making an electronics module according to claim 4, wherein the protective layer is selected from the group consisting essentially of perylene, anthraquinone, quinalizarin and alizarin.

6. The method for making an electronics module according to claim 5, wherein the protective layer has a vapor pressure of greater to or equal than about 10 torr, at a temperature of about 170° C.

7. The method of claim 1, wherein the step of removing the multilayer of high density interconnect structure to provide the channel comprises laser ablating the dielectric film layer in the area over the encapsulating volume.

8. The method of claim 1, wherein the step of removing the protective layer comprises heating the module to a temperature and pulling a vacuum sufficient to sublime the protective layer.

9. The method of claim 1, wherein the sensitive structure is an air bridge.

10. The method of claim 1, wherein the step of removing the protective layer leaves the sensitive structure essentially free of contamination.

11. The method of claim 1, wherein the encapsulating volume is substantially devoid of material.

* * * * *